United States Patent [19]
Chen

[11] Patent Number: 5,216,275
[45] Date of Patent: Jun. 1, 1993

[54] SEMICONDUCTOR POWER DEVICES WITH ALTERNATING CONDUCTIVITY TYPE HIGH-VOLTAGE BREAKDOWN REGIONS

[75] Inventor: Xingbi Chen, Sichuan, China

[73] Assignee: University of Electronic Science and Technology of China, China

[21] Appl. No.: 761,407

[22] Filed: Sep. 17, 1991

[30] Foreign Application Priority Data

Mar. 19, 1991 [CN] China ................. 91101845

[51] Int. Cl.$^5$ ................. H01L 29/76; H01L 29/70
[52] U.S. Cl. ................. 257/493; 257/492; 257/287; 257/266; 257/329; 257/655; 257/656
[58] Field of Search ................. 357/20, 23.8

[56] References Cited

U.S. PATENT DOCUMENTS

| | | | |
|---|---|---|---|
| 4,754,310 | 6/1988 | Coe et al. | 357/23.8 |
| 4,775,881 | 10/1988 | Ploog | 357/20 |

FOREIGN PATENT DOCUMENTS 1036666A 10/1989 China .

OTHER PUBLICATIONS

"An Ultra-Low On-Resistance Power MOSFET Fabricated...", by Ueda et al., IEEE, pp. 926-930, 1987.
"Self-Aligned MOSFET's with a Specific On-Resistance of...", by Chang et al., IEEE, pp. 2329-2333, 1987.
"Numerical and Experimental Analysis of 500-V Power DMOSFET...,"by Chang et al., IEEE Transactions, vol. 16, NY, Nov. 1989.

Primary Examiner—Jerome Jackson, Jr.
Attorney, Agent, or Firm—Majestic, Parsons, Siebert & Hsue

[57] ABSTRACT

A semiconductor power device wherein the reverse voltage across the p+-regions(s) and the n+-regions(s) is sustained by a composite buffer layer, shortly as CB-layer. The CB-layer contains two kinds of semiconductor regions with opposite types of conduction. These two kinds of regions are alternatively arranged, viewed from any cross-section parallel to the interface between the layer itself and the n+(or p+)-region. Whereas the hitherto-used voltage sustaining layer contains only one kind of semiconductor with single type of conduction in the same sectional view. Design guidelines are also provided in this invention. The relation between the on-resistance in unit area Ron and the breakdown voltage $V_B$ of the CB-layer invented is Ron oc$V_B^{1 \cdot 13}$ which represents a breakthrough to the conventional voltage sustaining layer, whereas the other performances of the power devices remain almost unchanged.

19 Claims, 4 Drawing Sheets

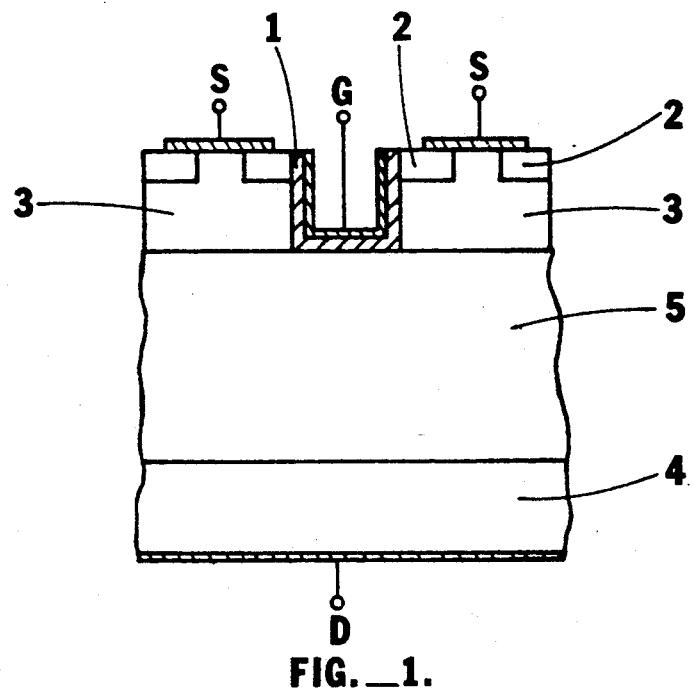
FIG._1.
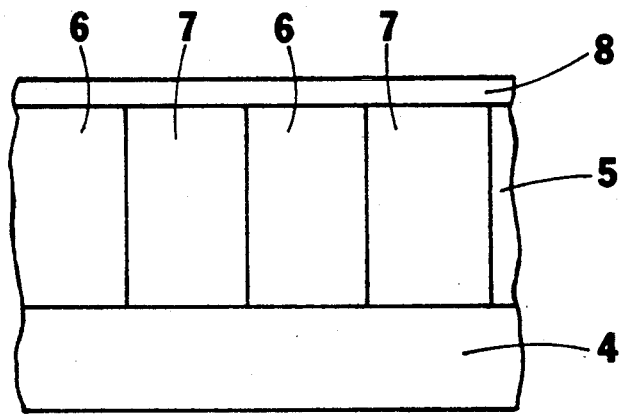
FIG._2.
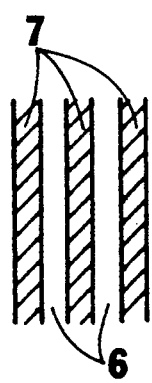
FIG._3-1.
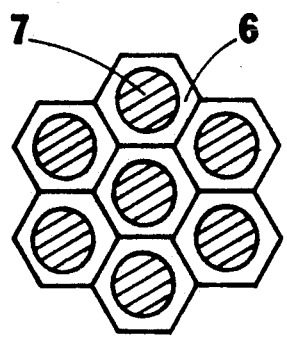
FIG._3-2.
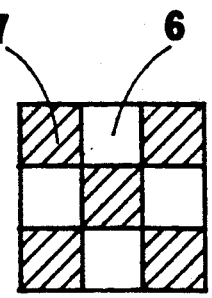
FIG._3-3.

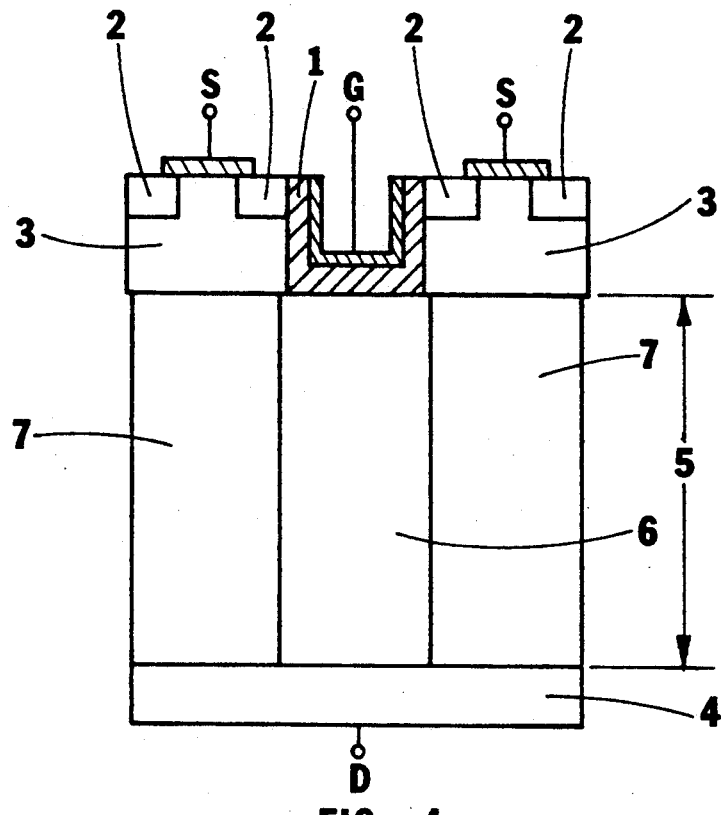
FIG._4.
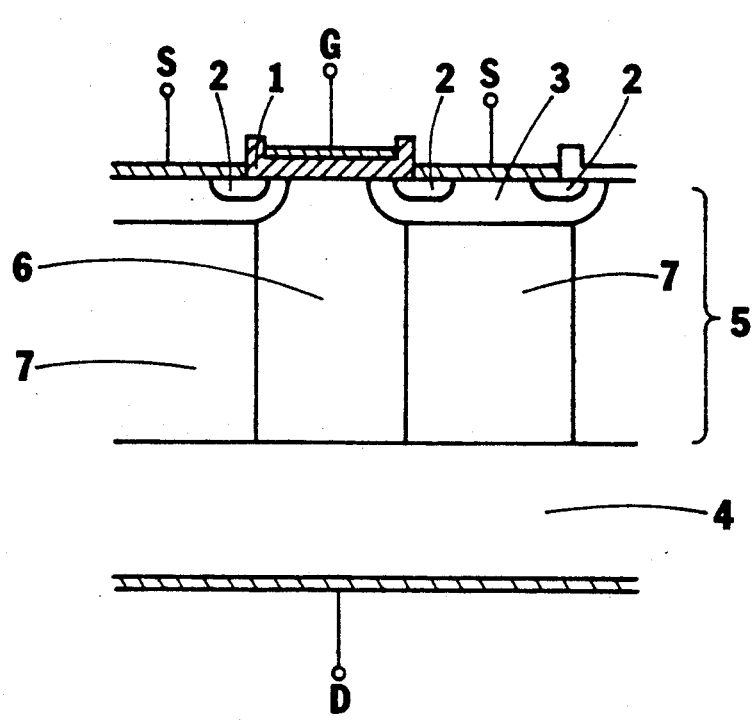
FIG._5.

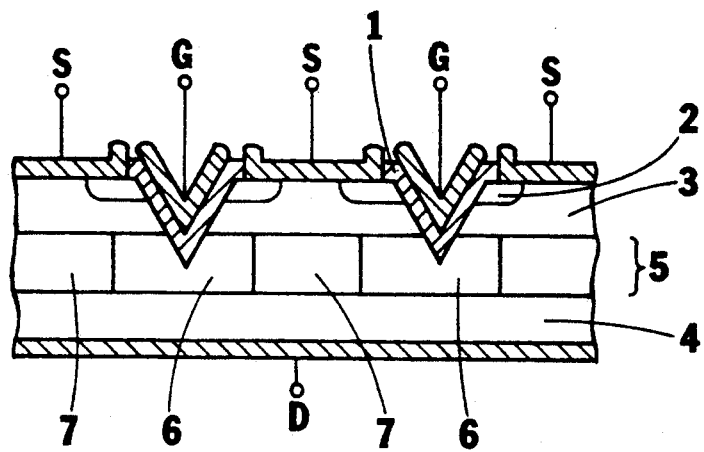
FIG._6.
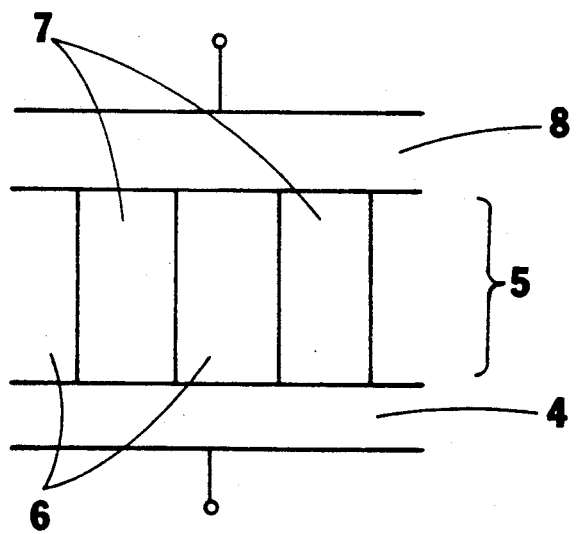
FIG._7.

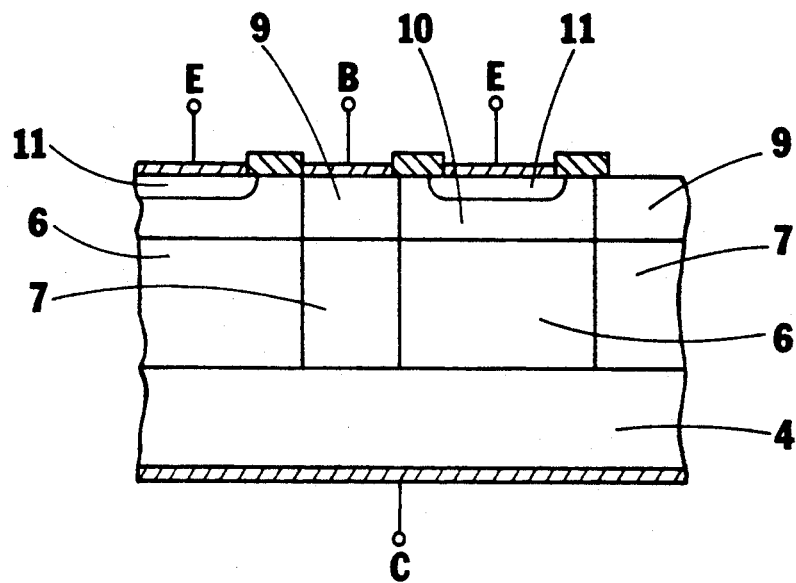
FIG._8.
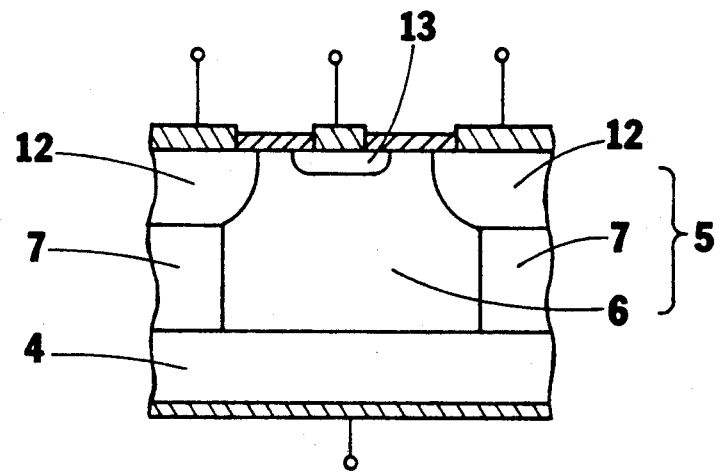
FIG._9.

SEMICONDUCTOR POWER DEVICES WITH ALTERNATING CONDUCTIVITY TYPE HIGH-VOLTAGE BREAKDOWN REGIONS

TECHNICAL FIELD

This invention relates to the semiconductor power devices.

BACKGROUND OF THE INVENTION

It is well-known that in the conventional semiconductor power devices, the reverse voltage applied across the n+-region(s) and p+-region(s) is sustained by a lightly doped semiconductor layer, called hereafter as voltage sustaining layer. For high voltage power devices, the on-resistance (or the on-voltage) is also dominantly determined by the voltage sustaining layer. The breakdown voltage mainly depends on the doping concentration and the thickness of the layer. The lower the concentration is and/or the larger the thickness is, the higher the breakdown voltage is, but the larger also the on-resistance (or the on-voltage) is. One of the most important problems of many power devices, especially of the majority devices like VVMOS, VDMOS and RMOS, is to get both high breakdown voltage and low on-resistance. For example, in the most advanced power MOSFET, RMOS(or UMOS), shown schematically in FIG. 1, the voltage sustaining layer is an n+-epi-layer, the theoretical limit of the on-resistance in unit area Ron is $Ron = 7.4 \times 10^{-9} V_B^{2.5} [\Omega \cdot cm^2]$, where $V_B$ is the breakdown voltage of the device. For references of the relation between Ron and $V_B$ see: [1] C. F. Wheately. G. M. Dolny. Solid-State Technology, November 1985.pp 121–128; [2] C.Hu. IEEE Trans. Electron Devices, Vol. ED-26, NO. 3.pp. 243–246(1979); [3] D. Ueda, H. Takagi, G. Hano. IEEE Trans. Electron Devices, Vol. ED-34.pp 926–930 (1987); (4) H. R. Chang. R. D. Black et al. IEEE Trans. Electron Devices, Vol. ED-34, pp. 2329–2333 (1987). Also, see a U.S. patent—[5] Goodman et al. U.S. Pat. No. 4,366,495, Dec. 23, 1982, where improvement has been made to reduce the practical on-resistance of the VDMOS, however, the devices disclosed in Goodman et al. retain the relation between Ron and $V_B$. This relation has been an obstacle for making high performance power devices. Moreover. Ron stated above refers to the conduction area of the voltage sustaining layer, but practically, there exists always some areas which do not contribute very much to the conduction. The examples of such areas are: the area under the source-body in a vertical MOSFET; the area under the base contact of the bipolar transistors.

SUMMARY OF THE INVENTION

In this invention, a new structure of the voltage sustaining layer is proposed by the inventor. This new type of layer is called composite buffer layer, or shortly, CB-layer. The active region of the power devices is made just above this layer. Then, the restriction of Ron versus $V_B$ for the power devices is remarkably released and the new power devices have much better performance in this respect, i.e. in the respect of the on-voltage and the breakdown voltage. This is due to the fact that the new devices have a new limitation relation between Ron and $V_B$ which is based upon a new principle.

The CB-layer proposed in this invention contains two kinds of regions with opposite types of conduction, i.e., the n-regions and the p-regions. These two regions of different conduction types are alternately arranged, viewed from any cross-section parallel to the interface between the CB-layer itself and the n+-region, whereas the voltage sustaining layer hitherto used contains only one uniform region with a single type of conduction of semiconductor (n-region, or p-region, or i-region) in the same sectional view. Each n-region and each p-region of the CB-layer has two surfaces contacted respectively with the n+-region and the p+-region. Except these two surfaces of each region, every p-region is surrounded by the neighbor n-regions and vice versa, as shown in FIG. 2. Thus, when the CB-layer is depleted, the n-regions and the p-regions contribute charges with opposite signs, and the fields induced by them cancel each other out for the most part. The doping concentrations of the n-regions and the p-regions, therefore, can be much higher than that in the conventional voltage sustaining layer. And, the on-resistance of the former is much lower than that of the latter.

The way of the arrangement of the p-regions and the n-regions in the CB-layer is called the layout. The layout may be any one of the following: 1) Interdigital layout: In the sectional view of the CB-layer, all the n-regions and the p-regions are stripe. The n-region and p-region are alternately arranged; 2) Layouts with hexagonal cell, or square cell, or rectangular cell, or triangular cell. In the sectional view of the CB-layer, hexagonal (or square, or rectangular, or triangular) cells are close-packed. All the n(or p)-regions are circle (or square, or rectangle. or triangle) and located at the middle of the cells, and each cell has one and only one such a region. The rest of the area of each cell is filled with p(or n)-region; 3) Layouts with mosaic structure. In the cross-section of the CB-layer, all the p-regions and the n-regions are square (or triangle, or hexagon), and the n-region and the p-region are alternately arranged. FIG. 3 shows schematically each example of the three kinds of layouts mentioned above. In all layouts, the smaller the size (or the width, or the radius) of each p-region as well as each n-region is, the lower the on-resistance in unit area is. In addition, in order to get the lowest on-resistance in unit area, the area of each p-region should be equal or almost equal to the area of each n-region.

The design guidelines for the CB-layer proposed by the inventor is as follows. If the breakdown voltage is required to be $V_B$ [V], then the thickness of the CB-layer should be $0.024 V_B^{1.2} [\mu m]$. For interdigital layout, if each n-region and each p-region have the same width $b[\mu m]$ then the effective donor concentration of the n-regions and the effective acceptor concentration of the p-regions are both equal to $7.2 \times 10^{16} V_B^{-0.2}/b [cm^{-3}]$. For the layouts with square mosaic structure, if the width of each region is $b[\mu m]$, then the effective donor concentration of the n-regions as well as the effective acceptor concentration of the p-regions are both equal to $9.1 \times 10^{16} V_B^{-0.2}/b [cm^{-3}]$. For other layouts, if each n-region and each p-region have the same area $A [\mu m^2]$, then the effective donor concentration as well as the effective acceptor concentration are both equal to $8.7 \times 10^{16} V_B^{-0.2}/\sqrt{A} [cm^{-3}]$.

The above design guidelines for the concentrations proposed by the inventor are for the lowest on-resistance in unit area-Ron. The value of Ron is then $Ron = 6 \times 10^{-7} b V_B^{1.3} [\Omega \cdot cm^2]$ for interdigital layout, and $Ron = 4.7 \times 10^{-7} b V_B^{1.3} [\Omega \cdot cm^2]$ for layout with square mosaic structure. If the practical doping concentrations of the p-regions and of the n-regions are higher than the given value, then the breakdown voltage decreases. On the other hand, if the doping concentrations are lower than the given value, then the on-resistance increases.

According to the design guidelines proposed by the inventor, the total charge of each n-region and the total charge of each p-region are required to be equal or almost equal in magnitude. If the relative difference of these two total charges exceeds 50%, then the breakdown voltage at the same thickness of the CB-layer decreases markedly. On the other hand, the cross-section area of n-regions is not required to be exactly equal to that of p-regions, since the important requirement according to this invention is mainly the total amounts of the effective doping impurities with two opposite charges being zero. This introduces some flexibility in design some power devices.

According to the idea of this invention, the carriers in all of the regions in the CB-layer are not required to flow from one region to another in the on-state, so that the existence of dielectric films between the neighbor regions, if any, is allowed. This provides an advantage in fabrication of the devices, e.g., during epitaxial growing of one kind of regions, the dielectric film can be served as an isolation to the diffusion of the dopants. For the same reason, if the n(p)-regions of the CB-layer are the conduction regions in the on-state, then the existence of a dielectric film between every p(n)-region of the CB-layer and the $n^+(p^+)$-region, if any, is allowed. Since the fields induced by the charges of both n-regions and p-regions still cancel each other out for the most part, this kind of dielectric film neither affects the breakdown voltage, nor affects the on-resistance, provided that the film is much thinner than the width of each conduction region.

The inventor proposes also another doping condition, the result of which is even better than uniform doping condition stated before, yielding a lowering of 25% of the on-resistance of the uniform doping case. This doping condition is simply to add an additional impurity gradient to the original uniform impurity concentration, making the donor concentration of the n-regions near the $n^+$-region higher than that near the $p^+$-region and the acceptor concentration of the p-regions near the $p^+$-region higher than that near the $n^+$-region. The magnitude of the concentration gradient is $3.0 \times 10^{20} V_B^{-2.6}$[cm$^{-4}$] for the interdigital layout and $4.6 \times 10^{20} V_B^{-2.6}$[cm$^{-4}$] for the other layouts. In that case, the thickness of the CB-layer should be 0.019 $V_B^{1.2}$[μm] for the interdigital layout and 0.017 $V_B^{1.2}$[μm] for the other layouts.

The inventor has studied the main parasitic effect of the CB-layer during the on-state-the JFET's formed by the conduction n(p)-regions clamped by the neighbor p(n)-regions. The results of the study show that the pinch-off current density of the JFET's is generally much higher than the current density rating of the conventional semiconductor power devices, also, the forward voltage at that current density is not much higher than that evaluated from a constant resistance equalling Ron stated before. That is to say, the effect of the parasitic JFET's do not affect markedly the advantage of the devices proposed in this invention.

The inventor has also studied the effect of the junction capacitances between n-regions and p-regions of the CB-layer. It turns out that using the CB-layer to replace a conventional voltage sustained layer does not decrease the switching speed of the device appreciably.

Various new power devices with much better performance in the respect of the on-voltage versus the breakdown voltage can be made on the base of the CB-layer proposed by the inventor:

1) Power vertical MOSFETs with a CB-layer. The channels of the MOSFETs are made on the top of the CB-layer. FIG. 4–FIG. 6 show schematically the structures of such MOSFETs, called by the inventor a joint name, the composite-buffer MOSFET, or shortly CB-MOS. The specific names are the CB-RMOS, the CB-VDMOS and the CB-VVMOS corresponding to FIG. 4, FIG. 5 and FIG. 6, respectively.

2) Power bipolar devices with a CB-layer. One of this family is the high voltage diode, called the CB-diode by the inventor, shown schematically in FIG. 7. Another of this family is the high voltage power bipolar transistor, called CB-Bipolar by the inventor, shown in FIG. 8.

3) Power static induction transistors with a CB-layer. FIG. 9 shows schematically a static induction transistor with surface gate above the CB-layer. Such static induction transistors, including that with buried gate are called CB-SIT by the inventor.

In summary, by utilizing the CB-layer proposed by the inventor, a lot of new kinds of power devices can be made. The behavior of the CB-layer is more or less like an intrinsic layer in the off-state. Since the fields induced by the charges of the depleted n and p-regions of the CB-layer are cancelled out for the most part. Therefore, the doping concentrations of both types of regions can be increased appreciably, making the on-resistance low and without affecting the breakdown voltage of a $p^+$-i-$n^+$ structure markedly. Moreover, since Ron is proportional to the lateral dimension of each region in the CB-layer, as can be seen from formulas of Ron stated before, so, it can be decreased continuously in accordance with the advancement of the technology of micro-processing.

The breakthrough of the relation between the on-resistance (or forward voltage) and the breakdown voltage from this invention is evident. For example, it is reasonable to set b=5 μm from the up-to-date technology, the on-resistance of a 800[V] CB-RMOS is then only 4% (or 2.8%) of that of the conventional RMOS if the uniform doping condition (or the optimum graded doping condition) is used.

Even if Ron for some devices need not be so low as given by the new relation, the advantage of this relation can still be taken in design of power devices. Since other restrictions connected with Ron and/or $V_B$ can be relieved then.

BRIEF DESCRIPTION OF THE DRAWING

FIG. 1 Shows the schematic structure of the RMOS.

FIG. 2 Shows the schematic structure of the devices with the CB-layer, proposed by the inventor, used as the voltage sustaining layer.

FIG. 3 Shows some typical layouts of the CB-layer, and

FIG. 3-1 Shows the interdigital layout;

FIG. 3-2 Shows the hexagonal layout;

FIG. 3-3 Shows the square mosaic layout.

FIG. 4 Shows the schematic structure of the CB-RMOS—an example of the devices proposed by the inventor.

FIG. 5 Shows the schematic structure of the CB-VDMOS—an example of the devices proposed by the inventor.

FIG. 6 Shows the schematic structure of the CB-VVMOS— an example of the devices proposed by the inventor.

FIG. 7 Shows the schematic structure of the CB-Diode—an example of the devices proposed by the inventor.

FIG. 8 Shows the schematic structure of the CB-Bipolar—an example of the devices proposed by the inventor.

FIG. 9 Shows the schematic structure of the CB-SIT—an example of the devices proposed by the inventor.

DETAILED DESCRIPTION OF THE INVENTION

By referring FIG. 1–FIG. 9, this invention can be further specified as follows.

FIG. 1 shows the RMOS, one of its fabrication process is:

(1) Epitaxial growth of an $n^-$(or $p^-$)-layer 5 on the $n^+$ (or $p^+$)-substrate 4; (2) Diffusion of dopants to form a $p^+$ (or $n^+$)-layer 3 on the top; (3) Masked diffusion or ion-implant to form $n^+$ (or $p^+$)-regions 2; (4) Selective trenching to make U-grooves and then growing gate-oxide 1 on the edges of the grooves: (5) Metal contacts—D.S.G.—formation.

FIG. 2 schematically shows a voltage sustaining structure using the CB-layer proposed by the inventor. One of its fabrication process is, (1) Epitaxial growth of an $n^-$(or $p^-$)-layer 5 on the $n^+$(or $p^+$)-substrate 4; (2) Selective trenching on 5 to make very deep U-grooves, where the bottoms of the grooves just reach 4; (3) Epitaxial growth of p(or n)-regions to fill up the grooves; (4) Epitaxial growth of a $p^+$(or $n^+$)-layer covering the CB-layer. The steps (2) and (3) can be replaced by a selective neutron transmutation doping (NTD), to transform local zones of the n(or p)-region into p(or n)-regions.

FIG. 3 shows the sectional view of some typical layouts of the CB-layer proposed by the inventor, where 6 denotes the N(or P)region, 7 denotes the P(or N)region, or vice versa.

FIG. 3-1 shows the interdigital layout.

FIG. 3-2 shows a hexagonal layout.

FIG. 3-3 shows the square mosaic layout.

FIG. 4 shows schematically the structure of the CB-RMOS, which is the most important example of the application of the CB-layer proposed by the inventor. An n(or p)-type epi-layer 5 is grown on the $n^+$(or $p^+$)-substrate 4, then make 5 be a CB-layer according to the method stated in the specification about FIG. 2, where in 5, 6 denotes n(or p)-region, 7 denotes p(or n)-region. Then, a $p^+$(or $n^+$)-region 3 is made on 5 by epitaxy or impurity diffusion, followed by a selective diffusion or ion-implant to make local $n^+$(or $p^+$)-regions 2 as the source. After that is done, a vertical trench is made, followed by a step of oxidation to make gate-oxide 1. Finally, metal contacts G, S and D are made. The cell geometry can be any one of the interdigital, square, hexagonal, triangle and circle layouts.

FIG. 5 shows schematically the structure of the CB-VDMOS with a CB-layer proposed by the inventor. The fabrication process of this device is almost the same as that of the CB-RMOS (refer to FIG. 4), except that the step of forming the top trench is not used here. Also, dielectric films between 6 and 7 and/or between 4 and 7, if any, are allowed.

FIG. 6 shows schematically the structure of the CB-VVMOS with a CB-layer proposed by the inventor. The fabrication process of this device is almost the same as that of the CB-RMOS (refer to FIG. 4), except that the top trenches formed are V-grooves, due to the <100> oriented wafer and a selective etching.

FIG. 7 shows schematically the structure of the high-voltage CB-Diode with a CB-layer proposed by the inventor. The CB-layer 5 is made on the $n^+$(or $p^+$)-substrate 4, 6 and 7 in this figure denote two regions with different types of conduction (i.e. n-type and p-type). A $p^+$(or $n^+$)-layer is made on the top of the CB-layer by diffusion, or by ion-implantation or by epitaxy. Two metal contacts are made, one at the top side, the other at the bottom side.

FIG. 8 shows schematically the structure of the CB-Bipolar with a CB-layer proposed by the inventor. The fabrication process for making 4 and 5 (6, 7) is the same as in the CB-diode (refer to FIG. 7). The outer-base $p^+$(or $n^+$)-region 9 and the inner-base p(or n)-region 10 are made successively by diffusion of impurities, followed by another diffusion (or ion-implant) to make the emitter $n^+$(or $p^+$)-region 11. Finally, metal contacts for E, B and C are made.

FIG. 9 shows schematically the structure of the CB-SIT with a CB-layer proposed by the inventor. Although the buried-gate CB-SIT can also be made, only the example of the surface-gate CB-SIT is shown. The CB-layer is made as the same process as stated about FIG. 2. The $p^+$(or $n^+$)-regions 12 are made on the CB-layer as the gate, then, on the top layer the $n^+$(or $p^+$)-regions, 13 is used, is made, between the neighbor gates, as the cathode (or anode). Finally, metal contacts are made.

From FIG. 4 to FIG. 9 the existence of dielectric films between 4 and 7, and/or between 6 and 7, if any, are allowed.

I claim:

1. A semiconductor power device comprising:
   a first contact layer of a first conductivity type;
   a second contact layer of a second conductivity type; and
   a voltage sustaining layer between said first and second contact layers, said voltage sustaining layer comprising first semiconductor regions of the first conductivity type and second semiconductor regions of a second conductivity type, said first and second semiconductor regions being alternately arranged, the voltage sustaining layer further comprising a thin dielectric layer located between one of said first semiconductor regions and one of said second semiconductor regions for isolating said one of said first semiconductor regions and said one of said second semiconductor regions, the first contact layer contacting said first semiconductor region forming a first interface, the second contact layer contacting the first and second semiconductor regions directly forming a second interface.

2. The semiconductor power device according to claim 1, wherein the first contact layer is isolated from the second semiconductor regions by a second thin dielectric layer.

3. The semiconductor device of claim 1, wherein said first and second interfaces are parallel to each other and perpendicular to the plane of the dielectric layer between said one of said first semiconductor regions and said one of said second semiconductor regions, and wherein the first and second semiconductor regions are shaped in a manner that in a cross-section of the voltage sustaining layer parallel to the first and second interface, the first and second semiconductor regions are square-shaped and form a mosaic pattern.

4. The semiconductor device of claim 1, wherein said first and second interfaces are parallel to each other and perpendicular to the plane of the dielectric layer between said one of said first semiconductor regions and said one of said second semiconductor regions, and wherein the first and second semiconductor regions are shaped in a manner that in a cross-section of the voltage sustaining layer parallel to the first and second interface, one of the first semiconductor regions and one of the second semiconductor regions form a close-packed hexagonal unit, and the dielectric layer forms a circle about the center of the hexagonal unit with one of said first (or second) semiconductor regions within the circle and one of said second (or first) semiconductor regions outside the circle.

5. The semiconductor device of claim 1, wherein the first contact layer is an $n^+$ layer, the second contact layer is a $p^+$ layer, the first semiconductor regions are n regions and the second semiconductor regions are p regions.

6. The semiconductor device of claim 1, wherein the first contact layer is a $p^+$ layer, the second contact layer is an $n^+$ layer, the first semiconductor regions are p regions and the second semiconductor regions are n regions.

7. The semiconductor power device according to claim 1, wherein the first and second semiconductor regions are doped with dopants and the total charge of the effective dopant concentration in the first semiconductor region does not exceed the total charge of the effective dopant concentration of the second semiconductor region by 50%.

8. The semiconductor power device according to claim 6, wherein the cross-sectional area of each first semiconductor region is not equal to each second semiconductor region.

9. The semiconductor power device according to claim 1, wherein the first and second semiconductor regions are doped with dopants and the effective charge distribution of dopants in every region of the voltage sustaining layer is uniform.

10. The semiconductor power device according to claim 1, wherein the first and second semiconductor regions are doped with dopants and the effective dopant distribution in every region in the voltage sustaining region is non-uniform, the dopant concentration in the first semiconductor regions is greater near the first contact layer than near the second contact layer, and the dopant concentration in the second semiconductor regions is greater near the second contact layer than near the first contact layer.

11. A semiconductor power device comprising:
a first contact layer of a first conductivity type;
a second contact layer of a second conductivity type; and
a voltage sustaining layer between said first and second contact layers, said voltage sustaining layer comprising first semiconductor regions of the first conductivity type and second semiconductor regions of a second conductivity type, said first and second semiconductor regions being alternately arranged, the first contact layer contacting all said first semiconductor regions and said second semiconductor regions to form a first interface, the second contact layer contacting with all the first and second semiconductor regions to form a second interface wherein the first and second semiconductor regions are doped with dopants and the effective dopant distribution in every region in the voltage sustaining region is non-uniform, the dopant concentration in the first semiconductor regions is greater near the first contact layer than near the second contact layer and the dopant concentration in the second semiconductor regions is greater near the second contact layer than near the first contact layer.

12. The semiconductor device of claim 11, wherein the first contact layer is an $n^+$ layer, the second contact layer is a $p^+$ layer, the first semiconductor regions are n regions doped with donors and the second semiconductor regions are p regions doped with acceptors.

13. The semiconductor device of claim 11, wherein the doped first contact layer is a $p^+$ layer, the second contact layer is an $n^+$ layer, the first semiconductor regions are p regions doped with acceptors and the second semiconductor regions are n regions doped with donors.

14. A semiconductor power device comprising:
a first contact layer of a first conductivity type;
a second contact layer of a second conductivity type; and
a voltage sustaining layer between said first and second contact layers, said voltage sustaining layer comprising first semiconductor regions of the first conductivity type and second semiconductor regions of a second conductivity type which are alternately arranged, the first contact layer contacting all said first semiconductor regions and said second semiconductor regions to form a first interface, the second contact layer contacting with all the first and second semiconductor regions directly to form a second interface wherein said first and second interface are parallel to each other and wherein the first and second semiconductor regions are shaped in a manner that in a cross-section of the voltage sustaining layer parallel to the first and second interface, one of the first semiconductor regions and one of the second semiconductor regions form a close packed hexagonal unit, the first semiconductor region is within a circle about the center of the close-packed hexagonal unit and one of said second semiconductor regions is outside the circle.

15. The semiconductor device of claim 14, wherein the first contact layer is an $n^+$ layer, the second contact layer is a $p^+$ layer, the first semiconductor regions are n regions and the second semiconductor regions are p regions.

16. The semiconductor device of claim 14, wherein the first contact layer is a $p^+$ layer, the second contact layer is an $n^+$ layer, the first semiconductor regions are p regions and the second semiconductor regions are n regions.

17. A semiconductor power device comprising:
a first contact layer of a first conductivity type;
a second contact layer of a second conductivity type; and
a voltage sustaining layer between said first and second contact layers, said voltage sustaining layer comprising first semiconductor regions of the first conductivity type and second semiconductor regions of a second conductivity type, said first and second semiconductor regions being alternately arranged, the first contact layer contacting said first semiconductor regions and said second semiconductor regions to form a first interface, the second contact layer contacting with all the first and second semiconductor regions directly to form a second interface wherein said first and second interface are parallel to each other and wherein the first and second semiconductor regions are shaped in a manner that in a cross-section of the voltage sustaining layer parallel to the first and second interface, the first and second semiconductor regions are square-shaped and form a mosaic pattern.

18. The semiconductor device of claim 17, wherein the first contact layer is an n+ layer, the second contact layer is a p+ layer, the first semiconductor regions are n regions and the second semiconductor regions are p regions.

19. The semiconductor device of claim 17, wherein the first contact layer is a p+ layer, the second contact layer is an n+ layer, the first semiconductor regions are p regions and the second semiconductor regions are n regions.

* * * * *